(12) United States Patent
Wallow et al.

(10) Patent No.: US 8,815,748 B2
(45) Date of Patent: Aug. 26, 2014

(54) METHOD OF FORMING SEMICONDUCTOR DEVICE WITH MULTIPLE LEVEL PATTERNING

(75) Inventors: Thomas Ingolf Wallow, San Carlos, CA (US); Ryoung-han Kim, San Jose, CA (US); Jongwook Kye, Pleasanton, CA (US); Harry Jay Levinson, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 2057 days.

(21) Appl. No.: 11/623,036

(22) Filed: Jan. 12, 2007

(65) Prior Publication Data

US 2008/0171447 A1 Jul. 17, 2008

(51) Int. Cl.
*H01L 21/302* (2006.01)
*H01L 21/027* (2006.01)
*G03F 7/40* (2006.01)
*H01L 21/311* (2006.01)
*G03F 7/00* (2006.01)

(52) U.S. Cl.
CPC ............... *H01L 21/0273* (2013.01); *G03F 7/40* (2013.01); *H01L 21/31144* (2013.01); *G03F 7/0035* (2013.01)
USPC ................................... 438/761; 257/E21.232

(58) Field of Classification Search
USPC ................. 438/761, 551, 671, 717, 736–738; 257/211, 635, E39.011, E31.123, 257/E21.035, E21.232
See application file for complete search history.

(56) References Cited

U.S. PATENT DOCUMENTS

| | | | |
|---|---|---|---|
| 5,877,075 A | 3/1999 | Dai et al. | |
| 6,440,862 B1 | 8/2002 | Batra et al. | |
| 6,528,351 B1 * | 3/2003 | Nathan et al. | 438/118 |
| 6,670,271 B1 | 12/2003 | Subramanian et al. | |
| 6,908,854 B2 * | 6/2005 | Chang | 438/637 |
| 7,033,735 B2 | 4/2006 | Ho et al. | |
| 7,078,348 B1 | 7/2006 | Singh et al. | |
| 2005/0000936 A1 * | 1/2005 | Boettiger et al. | 216/41 |

* cited by examiner

*Primary Examiner* — Shaun Campbell

(74) *Attorney, Agent, or Firm* — Farjami & Farjami LLP

(57) ABSTRACT

A method for forming a semiconductor device is provided including processing a wafer having a target material, forming a multilevel photoresist structure having a protection layer over the target material, and forming a multilevel recess in the target material with the multilevel photoresist structure.

19 Claims, 3 Drawing Sheets

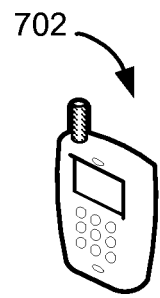
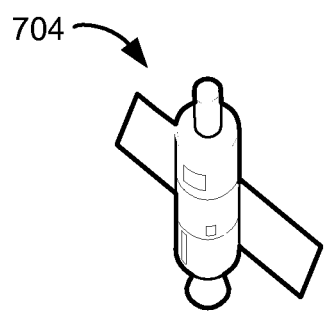
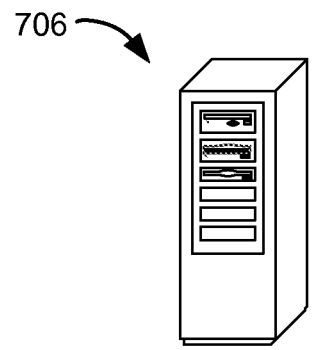
FIG. 7A  FIG. 7B  FIG. 7C
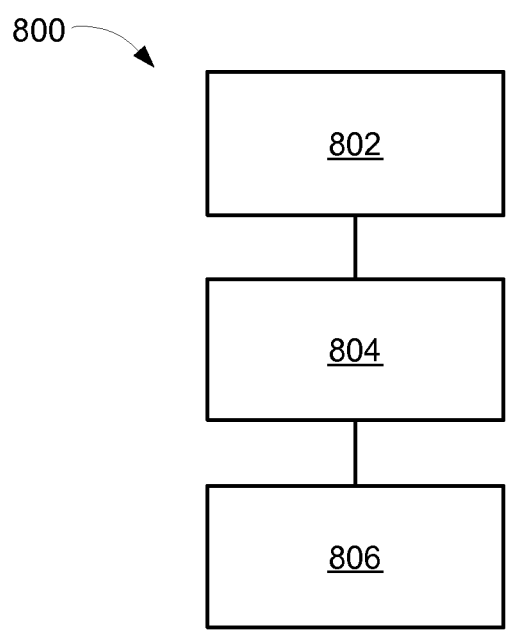
FIG. 8

METHOD OF FORMING SEMICONDUCTOR DEVICE WITH MULTIPLE LEVEL PATTERNING

CROSS-REFERENCE TO RELATED APPLICATION

The present application contains subject matter related to a concurrently filed U.S. Patent Application by Ryoung-han Kim, Thomas L. Wallow, Harry Levinson, Jongwook Kye, and Alden R. Acheta entitled "Method of Forming Semiconductor Device". The related application Ser. No. 11/623,031 is assigned to Advanced Micro Devices, Inc.

TECHNICAL FIELD

The present invention relates generally to a semiconductor device, and more particularly to a manufacturing method of a semiconductor device.

BACKGROUND ART

Modern electronics, such as smart phones, personal digital assistants, location based services devices, digital cameras, music players, servers, and storage arrays, are packing more semiconductor devices into an ever-shrinking physical space with expectations for decreasing cost. One cornerstone for devices to continue proliferation into everyday life is the integration of more functions into a given area of the semiconductor device. Numerous technologies have been developed to meet these requirements.

One approach to increase the density in a semiconductor device involves a technology to transform and shrink images onto a wafer. This process is called lithography or photolithography. Lithography systems have limitations of how small images may be reduced onto a wafer and these limitations bound the minimum dimensions of the semiconductor device. Some examples of the minimum dimensions for the semiconductor device are minimum gate length, structure width, or pitch between structures.

Various types of lithography systems, such as proximity lithography, contact lithography, projection lithography, or immersion lithography, have been used to increase density in a semiconductor device. Each has their advantages and drawbacks but all have minimum dimension limitations as discussed above.

Lithography systems use a light source to transfer an image from a mask to a wafer. Different light sources, such as a ultra-violet light of different wavelengths, different mask technologies, or both to improve the density in a semiconductor device. Again, each approach has their advantages and drawbacks but all have minimum dimension limitations as discussed above.

Other approaches use different combinations of the above components of a lithography system as well as different types of materials during the manufacture of a wafer. Yet other approaches use these various components in different manufacturing processes to improve density.

For example, semiconductor manufacturing may use a light source emitting light having a 193 nm wavelength to transfer the transform patterns to the wafer. As feature size decreases, the lithographic patterns approach its resolution limit. To extend the use of a lithography system, such as 193 nm lithography system, below its resolution limit, a double exposure technique is considered. The double exposure technique generates a pattern by decomposing one mask layer to two layers and two consecutive exposures forming the desire etch pattern. These approaches have their own drawbacks, such as production throughput impact.

Thus, a need still remains for a method for manufacture of a semiconductor device providing increased density, improved yields, improved throughput, lower cost, and increased use of existing manufacturing equipments. In view of the ever-increasing need to save costs and improve efficiencies, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for processing a wafer having a target material, forming a multilevel photoresist structure having a protection layer over the target material, and forming a multilevel recess in the target material with the multilevel photoresist structure.

Certain embodiments of the invention have other aspects in addition to or in place of those mentioned above. The aspects will become apparent to those skilled in the art from a reading of the following detailed description when taken with reference to the accompanying drawings.

BRIEF DESCRIPTION OF THE DRAWINGS

FIGS. 7A, 7B, and 7C are schematic views of examples of electronics systems in which various aspects of the present invention may be implemented; and FIG. 8 is a flow chart of a method for manufacture of the semiconductor device in an embodiment of the present invention.

BEST MODE FOR CARRYING OUT THE INVENTION

Figure 1:
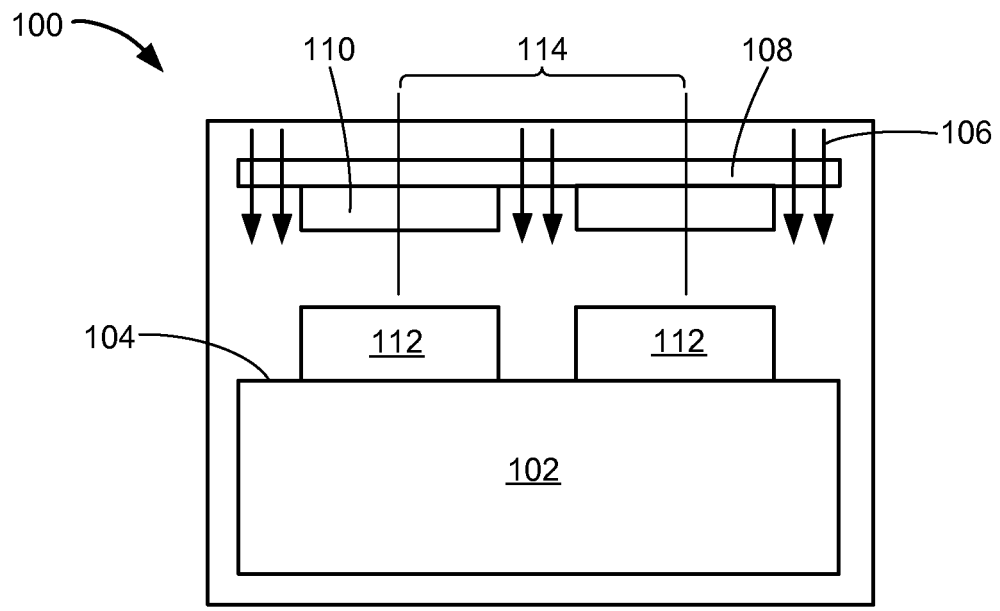
FIG. 1 is a cross-sectional view of a portion of a wafer in a first exposure phase in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention. Likewise, the drawings showing embodiments of the system are semi-diagrammatic and not to scale and, particularly, some of the dimensions are for the clarity of presentation and are shown greatly exaggerated in the drawing figures. In addition, where multiple embodiments are disclosed and described having some features in common, for clarity and ease of illustration, description, and comprehension thereof, similar and like features one to another will ordinarily be described with like reference numerals.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

For expository purposes, the term "horizontal" as used herein is defined as a plane parallel to the conventional semiconductor device surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material or photoresist, patterning, exposure, development, etching, cleaning, and/or removal of the material or photoresist as required in forming a described structure. The term "system" as used herein means and refers to the method and to the apparatus of the present invention in accordance with the context in which the term is used.

Semiconductor or semiconductor scale device, such as microelectromechanical system, manufacturing typically involves lithography systems (not shown) or also referred to as photolithography systems (not shown). Some examples of lithography systems are proximity lithography, contact lithography, projection lithography, or immersion lithography. The lithography systems use a light source (not shown) to transfer patterns (not shown) from a mask (not shown) onto a semiconductor wafer.

The term "pitch" as used herein refers to the separation between the parallel structures or the adjacent structures of the semiconductor wafer transferred by the lithography system used for the manufacture the semiconductor device. The pitch may be measured from side to side of the same side of the adjacent or parallel structures or from the centers of the adjacent or parallel structures. The term "minimum pitch" as used herein refers to the minimum pitch value that may be achieved by the lithography system used for the manufacture the semiconductor device.

Referring now to FIG. 1, therein is a cross-sectional view of a portion of a wafer 100 in a first exposure phase in an embodiment of the present invention. The first exposure phase is the first exposure step described and is not necessarily the first exposure step in the manufacture process of the wafer 100.

A target material 102, such as a semiconductor wafer or a microelectromechanical system wafer, of the portion of the wafer 100 undergoes the first exposure phase. The target material 102 may represent the wafer 100 at different levels, such as towards the beginning, middle, or end, of the manufacturing process of the wafer 100.

For illustrative purposes, the target material 102 is shown as a uniform structure, although it is understood that the target material 102 may be a structure that is not uniform, such as having a gradient of materials or multiple layers of materials. For example, the target material 102 may have an etch stop layer (not shown) or barrier layers (not shown) to prevent copper diffusion.

The first exposure phase has a pattern material, such as a positive tone photoresist, a negative tone photoresist, organic photoresist, or silicon containing photoresist, on an active side 104 of the wafer 100. The positive tone photoresist is considered opposite to the negative tone photoresist with respect to differences in chemical composition and reaction to light. The pattern material may be applied on the active side 104 by a number of available processes, such as spin coat and soft bake. Portions of the pattern material may be exposed to a light 106, such as an ultraviolet light. A light source (not shown) of a photolithography system (not shown) emits the light 106 for the manufacture of the wafer 100.

The pattern material may be light sensitive and depending on the type of material, the exposure to the light may harden or soften the portion of the pattern material exposed to the light 106. For example, a mask 108 has a mask pattern 110. The mask 108 blocks the light 106 with the mask pattern 110 and allows the light 106 to pass through openings of the mask pattern 110.

As in this example, the pattern material may be a positive tone photoresist such that the portion of the pattern material exposed to the light undergoes a chemical transformation. The chemical transformation may result from exposure to light or as a result of heating the pattern material following exposure to light. The exposed portion of the pattern material may be removed by a number of available processes, such as a chemical dissolving process, leaving a first pattern 112 from the remaining portion of the pattern material on the wafer 100 not exposed to the light 106. For illustrative purposes, the first pattern 112 is shown as a single layer, although it is understood that the first pattern 112 may be multiple layers.

Structures of the first pattern 112 are separated by a first pitch 114. The first pitch 114 may be greater than the minimum pitch or substantially the same as the minimum pitch. Other processes available to one ordinary skilled in the art may be used to form the first pattern 112 resulting in the value of the first pitch 114 in a range about minimum pitch to half of the minimum pitch.

Figure 2:
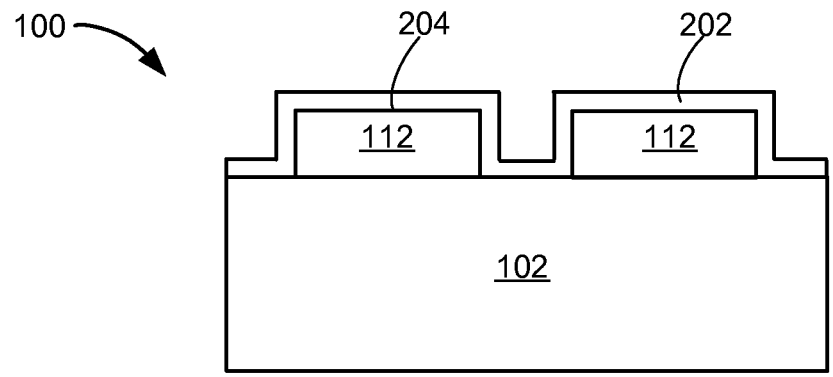
FIG. 2 is the structure of FIG. 1 in a surface treatment phase.

Referring now to FIG. 2, therein is shown the structure of FIG. 1 in a surface treatment phase. A stabilization material 202, such as a chemical reagent, is applied over the first pattern 112 and the target material 102. The application of the stabilization material 202 does not distort or minimally affects the first pattern 112.

The stabilization material 202 may be coated using a number of available processes, such as spin coating. For illustrative purposes, the stabilization material 202 is shown as a conformal layer over the first pattern 112 and the wafer 100, although it is understood that the stabilization material 202 may fill the space within the first pattern 112. Also for illustrative purposes, the stabilization material 202 is shown as a single layer, although it is understood that the stabilization material 202 may be more than one layer. Further for illustrative purposes, the stabilization material 202 is described as one material, although it is understood that the stabilization material 202 may be a gradient or multiple layers of different materials.

The stabilization material 202 reacts with the pattern material of the first pattern 112 without dissolving the first pattern 112. The chemical reaction, such as a chemical cross-linking reaction, between the first pattern 112 and the stabilization material 202 may be promoted or controlled with an optional heat treatment.

An interface 204 is formed between the surface of the first pattern 112 and the stabilization material 202 by the cross linking reaction. For example, the cross linking reaction may have an acid of the first pattern 112 diffuse into the stabilization material 202 resulting in the interface 204.

For example, the chemical reagents for the stabilization material 202 have chemical moieties that are reactive with chemical moieties at or near the surface of the first pattern 112. The stabilization material 202 may function as a surface stabilization of the first pattern 112. The stabilization material 202 may be an organic or inorganic coating.

The organic coating, such as a carbon-based polymer, may have functional groups capable of chemically reacting with the surface of the first pattern 112 or with chemical species at or near the surface of the first pattern 112. This surface chemical reaction forms a controlled and thin coating, such as the interface 204, having a thickness in a range of 10 nm or less. The interface 204 stabilizes the first pattern 112 for further processing.

The inorganic coating, such as a silicon containing polymer, may have functional groups capable of chemically reacting with the surface of the first pattern 112 or with chemical species at or near the surface of the first pattern 112. This surface chemical reaction forms a controlled and thin coating, such as the interface 204. The interface 204 stabilizes the first pattern 112 for further processing.

Figure 3:
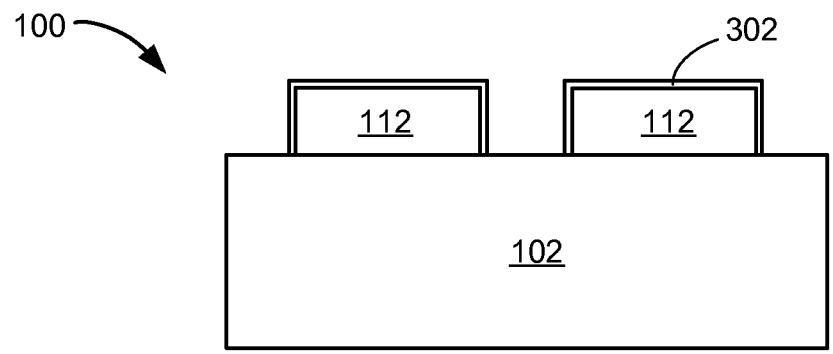
FIG. 3 is the structure of FIG. 2 in a pattern protection phase.

Referring now to FIG. 3, therein is shown the structure of FIG. 2 in a pattern protection phase. The stabilization material 202 of FIG. 2 that did not react with the first pattern 112 may be removed by a number of available cleaning processes, such as spin cleaning with a tetramethylammonium hydroxide (TMAH) solution. This cleaning process removes the unreacted portion of the stabilization material 202 leaving a protection layer 302, such as an insoluble protective layer, over the first pattern 112. The protection layer 302 is also along the sides of the first pattern 112. The target material 102 is shown exposed between the first pattern 112 and the protection layer 302.

The protection layer 302 provides good etching durability and mitigates pattern profile degradation of the first pattern 112. Etching durability of the protection layer 302 will be discussed further in FIG. 6.

The protection layer 302 protects the first pattern 112 over the target material 102 during cleaning process. For example, a process of cleaning the wafer 100 may be performed by spraying deionized water from a top portion of spin device with the wafer 100 spinning. This cleaning process generates high surface tension of deionized water on the first pattern 112 may result in pattern collapse without the protection layer 302.

Figure 4:
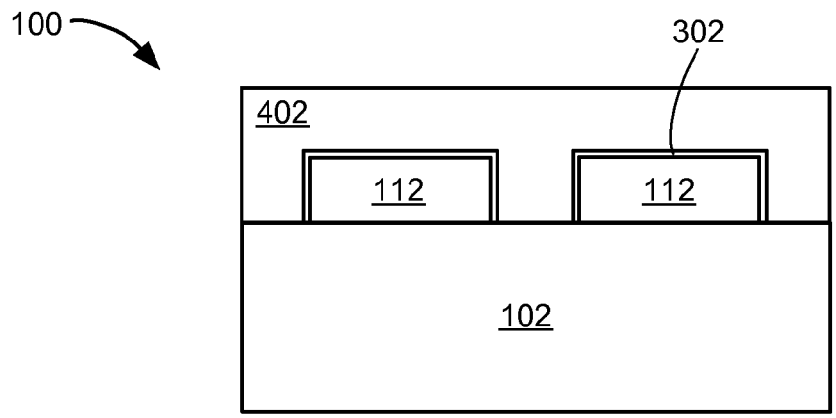
FIG. 4 is the structure of FIG. 3 in a resist coating phase.

Referring now to FIG. 4, therein is shown the structure of FIG. 3 in a resist coating phase. A photoresist material 402, such as a negative tone photoresist, a positive tone photoresist, or a water-borne negative tone photoresist, is applied over the wafer 100 covering the target material 102 and the first pattern 112 under the protection layer 302. The photoresist material 402 may be applied on the by a number of available processes, such as spin coat and soft bake. The protection layer 302 prevents pattern collapse of the first pattern 112 during the application of the photoresist material 402.

Figure 5:
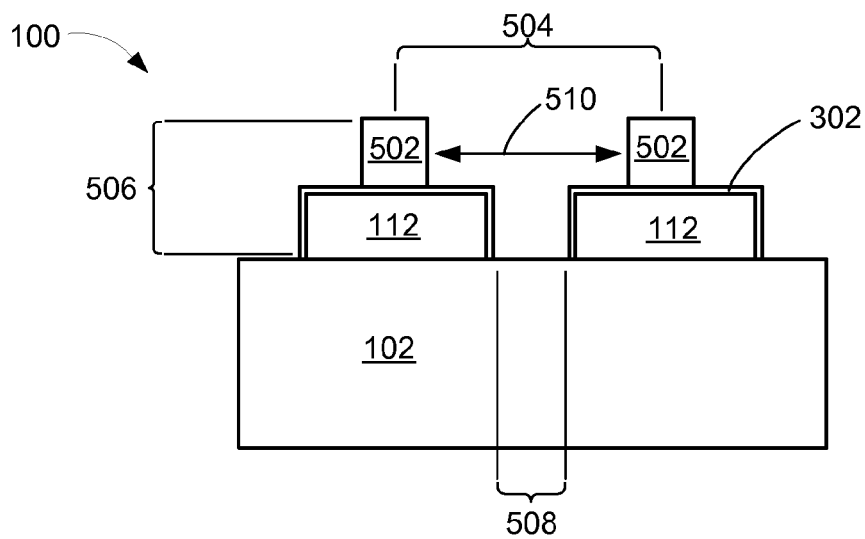
FIG. 5 is the structure of FIG. 4 in a second exposure phase.

Referring now to FIG. 5, therein is shown the structure of FIG. 4 in a second exposure phase. The second exposure may form a second pattern 502 with the photoresist material 402 of FIG. 4 over the first pattern 112 and the protection layer 302. The second pattern 502 may be formed by a similar process to the first exposure phase. The protection layer 302 provides protection to the first pattern 112 in the second exposure phase.

Structures of the second pattern 502 are separated by a second pitch 504. The second pitch 504 may be greater than the minimum pitch or substantially the same as the minimum pitch.

The second pattern 502 over the first pattern 112 and the protection layer 302 forms a multilevel photoresist structure 506 over the target material 102. The first pattern 112 exposes the target material 102 in a first opening 508 between the structures of the first pattern 112. A second opening 510 between structures of the second pattern 502 exposes the protection layer 302.

Figure 6:
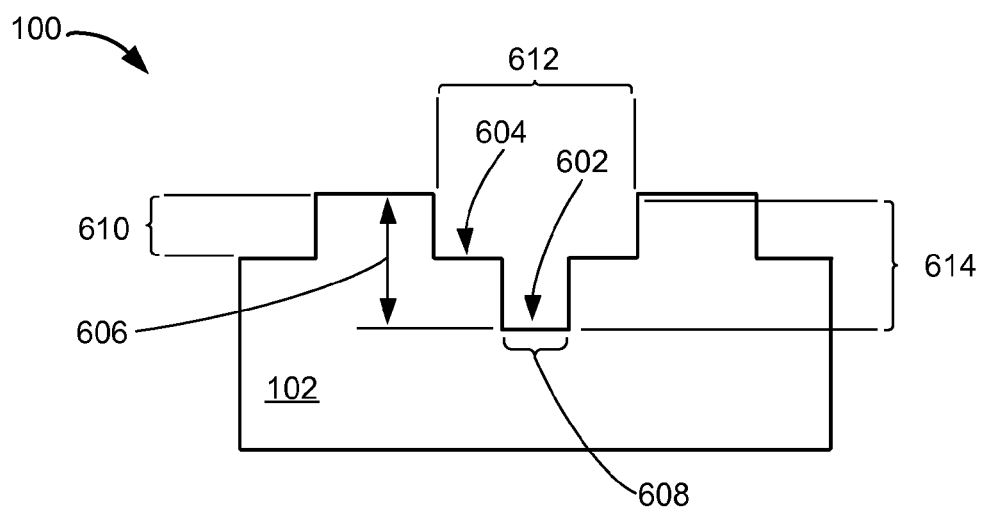
FIG. 6 is the structure of FIG. 5 in an etch phase.

Referring now to FIG. 6, therein is shown the structure of FIG. 5 in an etch phase. The stepped profile of the multilevel photoresist structure 506 of FIG. 5 is transferred to the target material 102 in this phase. The structure of FIG. 5 undergoes an etching process forming a first recess 602, such as a trench or a via, and a second recess 604, such as a contact or an etch back region, in the target material 102. The first recess 602 has a first depth 606 and a first width 608. The first width 608 is substantially the same width of the first opening 508 of FIG. 5. The second recess 604 has a second depth 610 and a second width 612. The second width 612 is substantially the same width of the second opening 510 of FIG. 5. A multilevel recess 614 having the first recess 602 and the second recess 604 may be formed in a number of different ways.

For example, the first depth 606 and the second depth 610 may be determined by the etching rate of the multilevel photoresist structure 506 and the etching rate of the target material 102. Another example, patterned etch stop layers (not shown) in the target material 102 may determine the first depth 606 and the second depth 610. Yet another example, different etch chemistries may be used to etch different materials and different layers in the target material 102 as well as the multilevel photoresist structure 506. A combination of the above may be used for forming the multilevel recess 614.

It has been discovered that the formation of the multilevel photoresist structure having the protection layer, such as a surface stabilization layer, between the photoresist levels may be used in a single etch step for forming multilevel etch patterns in the target wafer layer or layers. An etch process is not performed between the first develop phase and the second develop phase resulting in improved throughput of the manufacturing line.

The wafer 100 may be further processed and diced forming semiconductor dice, integrated circuit dice, or other semiconductor device scale device, such as microelectromechanical system (MEMS). The first pattern 112 of FIG. 1 and the second pattern 502 of FIG. 5 may be removed upon the further processing the wafer 100. Other types of devices may also be formed using the present invention, such as optical devices.

Referring now to FIGS. 7A, 7B, and 7C, therein are shown schematic views of examples of systems in which various aspects of the present invention may be implemented. A smart phone 702, a satellite 704, and a compute system 706 are examples of the systems using the present invention. The systems may be any system that performs any function for the creation, transportation, storage, and consumption of information. For example, the smart phone 702 may create information by transmitting voice to the satellite 704. The satellite 704 is used to transport the information to the compute system 706. The compute system 706 may be used to store the information. The smart phone 702 may also consume information sent from the satellite 704.

The electronic systems, such as the smart phone 702, the satellite 704, and the compute system 706, include a one or more subsystem, such as a printed circuit board having the present invention or an electronic assembly having the present invention. The electronic system may also include a subsystem, such as an adapter card.

Referring now to FIG. 8, therein is a flow chart of a method 800 for manufacture of the semiconductor device in an embodiment of the present invention. The method 800 includes providing processing a wafer having a target material in a block 802; forming a multilevel photoresist structure having a protection layer over the target material in a block 804; and forming a multilevel recess in the target material with the multilevel photoresist structure in a block 806.

It has been discovered that the present invention thus has numerous aspects.

A principle aspect that has been discovered is that the embodiments increase the output of the manufacturing line processing. The formation of a protection layer over a first lithographic pattern provides the ability for forming multilevel photoresist structure. The multilevel photoresist structure may be used in a single etch step for forming multilevel etch patterns in the target wafer layer or layers. An etch process is not performed between the first exposure phase and the second exposure phase resulting in improved throughput of the manufacturing line.

Another aspect of the embodiments provides multilevel etch patterns in a single etch step with the multilevel photoresist structure.

Yet another aspect of the embodiments provides double patterning capability without an etch step between multiple exposures resulting in improved throughput of the manufacturing line.

Yet another aspect of the embodiments provides structures, such as contacts or lines, having the pitch that is a fraction of the minimum pitch or other feature sizes that are a fraction of the feature sizes of the lithography system capability.

Yet another aspect of the embodiments provides the multilevel photoresist structure may be used for any layer or layers in the wafer processing.

Yet another aspect of the embodiments may be performed with layers having different materials, such as electrically conductive or electrically nonconductive, to increase density of circuits, routing in redistribution layers, spacers, or MEMS elements.

Yet another aspect of the embodiments provides the method for the manufacture of devices of different structures of varying sizes, configurations, and stacking options.

Yet another aspect of the embodiments provides reuse of existing and mature lithography systems while providing increased integration and density.

Yet another important aspect of the embodiments is that it valuably supports and services the historical trend of reducing costs, simplifying systems, and increasing performance.

These and other valuable aspects of the embodiments consequently further the state of the technology to at least the next level.

Thus, it has been discovered that the semiconductor system of the present invention furnishes important and heretofore unknown and unavailable solutions, capabilities, and functional aspects for increased throughput, increased density, improved yield, and lowered cost. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

What is claimed is:

1. A method for forming a semiconductor device comprising:
   processing a wafer having a target material;
   forming a multilevel photoresist structure having a protection layer over the target material; and
   forming a multilevel recess in the target material with the multilevel photoresist structure;
   wherein the protection layer is formed by creating a stabilization material over the target material wherein the stabilization material has portions that do not react with the target material; and
   removing the portions of the stabilization material that do not react with the target material.

2. The method as claimed in claim 1 wherein forming the multilevel photoresist structure having the protection layer includes:
   forming a first pattern over the target material;
   forming the protection layer on a surface of the first pattern; and
   forming a second pattern over the protection layer.

3. The method as claimed in claim 1 wherein forming the multilevel photoresist structure having the protection layer over the target material includes forming the multilevel photoresist structure having a first width and a second width, the first width and the second width are not the same.

4. The method as claimed in claim 1 wherein forming the multilevel recess in the target material includes forming the multilevel recess having substantially a first width and substantially a second width, the first width and the second width are not the same.

5. The method as claimed in claim 1 further comprising:
   singulating the semiconductor device from the wafer; and
   forming an electronic system or a subsystem with the semiconductor device.

6. The method as claimed in claim 1 wherein forming the multilevel photoresist structure having the protection layer over the target material includes:
   forming a first pattern over the target material;
   applying the stabilization material over the first pattern; and
   forming an interface between the stabilization material and a surface of the first pattern.

7. The method as claimed in claim 1 wherein forming the multilevel recess in the target material with the multilevel photoresist structure includes forming the multilevel recess having a first depth and a second depth.

8. The method as claimed in claim 1 wherein forming the multilevel recess in the target material with the multilevel photoresist structure includes forming the multilevel recess having a first recess and a second recess.

9. The method as claimed in claim 1 wherein forming the multilevel photoresist structure having the protection layer over the target material includes forming a first pattern having a first pitch.

10. The method as claimed in claim 1 wherein forming the multilevel photoresist structure having the protection layer over the target material includes:
    forming a first pattern having a first pitch; and
    forming a second pattern having a second pitch, the first pitch and the second pitch are not the same.

11. A method for forming a semiconductor device comprising:
    processing a wafer having a target material;
    forming a first pattern having a first width over the target material;
    forming a protection layer over the first pattern; and
    forming a second pattern having a second width over the protection layer without an etching step between the forming the first pattern and the forming the second pattern; and forming a multilevel recess in the target material with the first pattern and the second pattern;

wherein the protection layer is formed by creating a stabilization material over the target material wherein the stabilization material has portions that do not react with the target material; and removing the portions of the stabilization material that do not react with the target material.

12. The method as claimed in claim 11 wherein:

forming the first pattern includes:

forming the first pattern comprised of photoresist; and forming the second pattern includes:

forming the second pattern comprised of photoresist.

13. The method as claimed in claim 11 wherein:

forming the first pattern includes:

forming the first pattern comprised of a first tone photoresist; and forming the second pattern includes:

forming the second pattern comprised of a second tone photoresist, the second tone photoresist is opposite the first tone photoresist.

14. The method as claimed in claim 11 wherein forming the second pattern includes forming the second pattern comprised of water-borne negative tone photoresist.

15. The method as claimed in claim 11 wherein forming the multilevel recess in the target material with the first pattern and the second pattern includes etching the multilevel recess in the target material with the first pattern and the second pattern.

16. The method as claimed in claim 11 wherein processing the wafer having the target material includes processing the wafer having the target material for an integrated circuit.

17. The method as claimed in claim 11 wherein processing the wafer having the target material includes processing the wafer having the target material for a microelectromechanical system.

18. The method as claimed in claim 11 wherein processing the wafer having the target material includes processing the wafer having the target material for an optical device.

19. The method as claimed in claim 11 wherein forming the protection layer over the first pattern includes:

coating the stabilization material over the target material and the first pattern; and heating the first pattern and the stabilization material.

\* \* \* \* \*